(12) United States Patent
Fron

(10) Patent No.: US 7,720,447 B2
(45) Date of Patent: May 18, 2010

(54) RADIOFREQUENCY (RF) AND/OR MICROWAVE POWER AMPLIFICATION DEVICE AND CORRESPONDING RADIOCOMMUNICATION TERMINAL

(75) Inventor: Gregory Fron, Coubert (FR)

(73) Assignee: Wavecom, Issy-les Moulineaux Cedex (FR)

( * ) Notice: Subject to any disclaimer, the term of this patent is extended or adjusted under 35 U.S.C. 154(b) by 634 days.

(21) Appl. No.: 10/584,227

(22) PCT Filed: Nov. 19, 2004

(86) PCT No.: PCT/FR2004/002962

§ 371 (c)(1),
(2), (4) Date: Jun. 23, 2006

(87) PCT Pub. No.: WO2005/071829

PCT Pub. Date: Aug. 4, 2005

(65) Prior Publication Data

US 2007/0159258 A1    Jul. 12, 2007

(30) Foreign Application Priority Data

Dec. 23, 2003 (FR) .................................. 03 15340

(51) Int. Cl.
*H03C 1/52* (2006.01)
*H04B 1/02* (2006.01)

(52) U.S. Cl. ....................... 455/106; 455/300; 455/301; 455/575.5

(58) Field of Classification Search ................ 455/106, 455/300, 301, 575.5, 63.1, 575.1, 90.3, 575.8, 455/114.2, 117, 126, 128–129, 296; 343/702, 343/841; 330/310
See application file for complete search history.

(56) References Cited

U.S. PATENT DOCUMENTS

| | | | |
|---|---|---|---|
| 6,009,311 A * | 12/1999 | Killion et al. | 455/63.1 |
| 6,211,671 B1 * | 4/2001 | Shattil | 324/225 |
| 6,564,038 B1 * | 5/2003 | Bethea et al. | 455/63.1 |
| 6,681,125 B1 * | 1/2004 | Woo | 455/556.1 |
| 6,754,476 B1 * | 6/2004 | Reinhardt | 455/127.1 |
| 6,957,051 B1 * | 10/2005 | Korisch et al. | 455/107 |

FOREIGN PATENT DOCUMENTS

| | | |
|---|---|---|
| EP | 1 028 525 A2 | 8/2000 |
| EP | 1 128 716 A2 | 8/2001 |
| JP | 08195632 | 7/1996 |

* cited by examiner

*Primary Examiner*—Pablo N Tran
(74) *Attorney, Agent, or Firm*—Westman, Champlin & Kelly, PA; David D. Brush

(57) ABSTRACT

The disclosure relates to a radio frequency (RF) and/or microwave power amplification device which is intended, for example, for a radio communication terminal, comprising means for shielding the device and means for controlling the power delivered as output from said device, said power-control means comprising a power servo loop having power-amplification means, reference means, detection means and comparison means. The aforementioned control means also comprise at least one sensor to detect the energy radiated inside the device.

11 Claims, 5 Drawing Sheets

RADIOFREQUENCY (RF) AND/OR MICROWAVE POWER AMPLIFICATION DEVICE AND CORRESPONDING RADIOCOMMUNICATION TERMINAL

CROSS-REFERENCE TO RELATED APPLICATION

This Application is a Section 371 National Stage Application of International Application No. PCT/FR2004/002962, filed Nov. 19, 2004 and published as WO 2005/071829 on Aug. 4, 2005, not in English.

FIELD OF THE DISCLOSURE

The field of the disclosure is that of power amplification. More specifically, the disclosure relates to a radiofrequency and/or microwave power amplification device, in particular intended for radiocommunication terminals such as cellular telephones, PDAs (Personal Digital Assistant), portable computers, and so on.

BACKGROUND

In cellular telephones, such power amplifiers are intended to generate and supply the antenna with an operating power adequate for the terminal to be capable of communicating with the nearest base station. According to the GSM (Global System for Mobile Communications) standard, for example, the power amplifier generates the power needed by the antenna per 2-dB step.

FIG. 1 shows the general operation of such a power amplifier 11 in the general diagram of a cellular telephone. As shown in FIG. 1, the power amplifier 11 generates the power needed by the antenna 10, via an antenna switch 110, which makes it possible to select the frequency band and the operating mode (transmission or reception). Without describing this figure in greater detail, it can be noted that the power amplifier 11 interacts with a block 12 performing filtering and matching operations, and a block 14 performing transmission/reception functions. The baseband portion 13 was not detailed in FIG. 13. The blocks 12 to 14 of FIG. 1 are not an integral part of this invention, and are not therefore described in greater detail. For additional information, reference can be made to the conventional diagrams of radiocommunication terminals, as recommended, for example, by GSM or UMTS (Universal Mobile Telecommunication System) standards.

As shown in FIG. 1, such a power amplification device 11 includes a module 111 for controlling the power amplifier 112.

Such a control module 111 serves to control the power supplied at the output of the power amplification device 11, in particular according to the operating temperature, the supply voltage of the cellular telephone battery, the load impedance, and so on.

Today, a number of techniques for producing such a control module 111 are known, and are shown in FIGS. 2A to 2C.

The first of these techniques, shown in FIG. 2A, consists of producing a system for closed-loop control of the power supplied.

The power amplification device of FIG. 2A includes an amplifier 21, which, in a specific embodiment of the invention, can be preceded and followed by optional coupling capacitors 20, 22. The control loop of the power supplied at the output 30, intended for the antenna of the radiocommunication terminal, includes:

a coupler 23;
a module 24 for detecting the RF power, also including a comparator, also called a "detector/comparator";
a polarisation controller 25.

The ramp 26 supplies the detector/comparator 24 with a reference voltage, coming from the baseband 13. The coupler 23 samples some of the power (RF or microwave) supplied by the amplifier 21, and transmits it to the detector/comparator 24, which generates a voltage based on this measured power. The latter then compares the voltage that it has generated with the reference voltage supplied by the baseband 26. If the power supplied differs from the reference power (associated with the reference voltage supplied by the baseband 26), the polarisation controller 25 then modifies the voltage supplied to the amplifier 21, so as to adjust the power supplied at the output 30.

Two so-called "open-loop" techniques for controlling the power supplied at the output of such a power amplifier are also known, and are shown in FIGS. 2B and 2C.

The assembly of FIG. 2B provides control of the current power amplifier 21. Again, in the specific alternative of FIG. 2B, such an amplifier 21 is preceded and followed by two optional coupling capacitors 20, 22. The assembly of FIG. 2B includes, as above, a ramp 26 providing a reference from the baseband 13, a comparator 27 and a polarisation controller 25. The voltages Vbat and Vcc correspond respectively to the voltage supplied by the battery of the radiocommunication terminal and the voltage supplying the power amplifier 21.

Knowing the value of the resistance 28, the intensity of the current I passing therethrough can be deduced. After a comparison 24 of this intensity with the reference intensity 26, the polarisation controller 25 corrects the power amplifier set value 21, so as to adjust the power supplied at the output 30.

The assembly of FIG. 2C shows the final known technique, consisting of controlling the supply voltage of the amplifier 21 in an open loop. Again, in the specific embodiment of FIG. 2C, a first optional coupling capacitor 20 precedes the amplifier 21, and a second optional coupling capacitor 22 follows it. A MOSFET transistor 29 is used to control the supply voltage Vcc of the amplifier 21. This control is achieved by means of a comparator 27, of which the set value is given by a ramp 26 connected to the baseband 13. The voltage Vcc is controlled so that the power RF or microwave supplied at the output 30 of the amplifier is equal to the reference power associated with the reference voltage given by the ramp 26.

These various techniques of the prior art have a number of disadvantages.

Although the closed-loop control technique of FIG. 2A provides excellent control of the output power, while having a satisfactory current consumption, has the disadvantage of inducing RF losses on the order of 0.2 to 0.3 dB. However, such a system performs very well when the load varies, i.e. when the antenna is of mediocre quality.

The closed-loop control of FIG. 2A is therefore the highest-performing technique of the three prior art techniques described above, but it is also the most expensive technique. Moreover, the technologies used for the design of the couplers are different from those used for the design of amplifier chips 21 or controller chips 25 (conventionally AsGa or CMOS), which leads to major integration problems.

The open-loop voltage control of FIG. 2C has mediocre performance, in terms of both power control and current consumption, when the power supplied is low. Although it would be easier to integrate such a device in the case of FIG. 2A, this technique also has the disadvantage of a voltage drop through the MOSFET transistor, due to the existence of a parasitic resistance, which leads to reduced efficiency.

Finally, the open-loop current control technique of FIG. 2B has improved performances compared to the technique of FIG. 2C in terms of integrability, current consumption and power loss. However, it does not allow for power control as effective as that of the closed-loop technique of FIG. 2A.

SUMMARY

An embodiment of the present invention is directed to a radiofrequency (RF) and/or microwave power amplification device, in particular for radiocommunication terminals, including means for shielding said device and means for controlling power supplied at the output of said device, including a power control loop having reference means, detection means, comparison means and power amplification means.

According to an embodiment of the invention, said control means also include at least one sensor for detecting energy radiated in said device.

Thus, an embodiment of the invention is based on an entirely novel and inventive approach to power control in a radiofrequency or microwave amplification device, in particular intended to supply an antenna of a radiocommunication terminal, such as a cellular telephone, PDA, and so on. Indeed, an embodiment of the invention proposes producing such a closed-loop control (as for the prior art solution described above in relation to FIG. 2A), so as to obtain satisfactory operating performance, while avoiding the use of expensive couplers, which are difficult to integrate.

Instead of this or these coupler(s), an embodiment of the invention proposes using one or more sensor(s), acting as an antenna, enabling the energy radiated in the device to be detected. The an embodiment of the invention therefore differs significantly from the techniques of the prior art, which were all based on the measurement or evaluation of conducted energy or power, optionally after attenuation, and not on the evaluation of radiated power.

As it provides good operating performances, in particular in terms of control of the power supplied at the output of the device, the device of an embodiment of the invention therefore also has advantages in terms of cost and integration, with respect to the prior art.

Said shielding means advantageously involve a coupling between said power amplification means and said sensor.

Such a shielding phenomenon is imaginatively implemented according to an embodiment of the invention, whereas until now, according to all of the prior art techniques, it was considered to be an adverse effect that must be avoided at all costs. An embodiment of invention therefore proposes an entirely innovative approach that goes against the prejudices of a person skilled in the art.

Said sensor preferably belongs to the group including:
  inductors;
  routing lines of a printed circuit of said device;
  MEMS (Micro-Electro-Mechanical Systems);
  radiating elements printed on a printed circuit of said device;
  tuned LC or RLC circuits.

According to an advantageous feature of an embodiment of the invention, said power amplification means and said sensor are placed near one another, so as to optimise said coupling.

Thus, while it has been attempted until now to maximise the distance between the coupler and the power amplifier, so as to avoid any adverse coupling phenomenon, the an embodiment of invention by contrast proposes bringing the amplifier and the sensor as close together as possible, so as to increase this phenomenon, and thus optimise the operation of the device. Much more compact and less bulky devices than those of the prior art can thus be designed.

Said shielding means preferably cause an attenuation of at least 10 dB of energy outside said device, detected by said sensor, with respect to said energy radiated in said device, detected by said sensor.

If this attenuation is higher, typically at least equal to 20 dB, the operation of the device is further optimised. Thus, the antenna of the cellular telephone is prevented from causing disturbances to the operation of the power amplification device.

When said sensor is a tuned LC or RLC circuit, the values of the components of said tuned circuit are advantageously selected so as to maximise said power supplied at the output at at least one predetermined operating frequency of said device.

For example, in the case of a GSM power amplifier, the value of the components is selected so as to obtain, at the output, two additional bumps at 900 MHz and 1800 MHz.

Said control means advantageously enable to control said power supplied at the output according to at least one parameter belonging to the group including:
  an operating temperature of said device;
  a supply voltage of said device;
  a load impedance of said device.

According to an advantageous alternative embodiment of the invention, said sensor is integrated in said detection means.

Thus, the integration and compactness of the device is enhanced. The sensor can, for example, be included on the top of the chip of the detector/comparator.

Said shielding means advantageously include a metal shielding cover having a surface substantially parallel to a printed circuit forming the base of said device and four surfaces substantially perpendicular to said surface coming into contact with each of the edges of said printed circuit.

The shielding means can also take the form of any metal element covering the printed circuit, connected to its ground, and performing a shielding function.

An embodiment of invention also relates to a radiocommunication terminal including a power amplification device as described above.

Other features and advantages of one or more embodiments of the invention will become clearer from the following description of a preferred embodiment, given by way of a simple illustrative and non-limiting example, and appended drawings.

DETAILED DESCRIPTION OF ILLUSTRATIVE EMBODIMENTS

An embodiment of the invention is based on the use of a radiating element enabling the energy radiated (and not conducted) in a power amplification device to be detected, so as to perform a closed-loop control of the RF or microwave power supplied at the output of said device.

Figure 3:
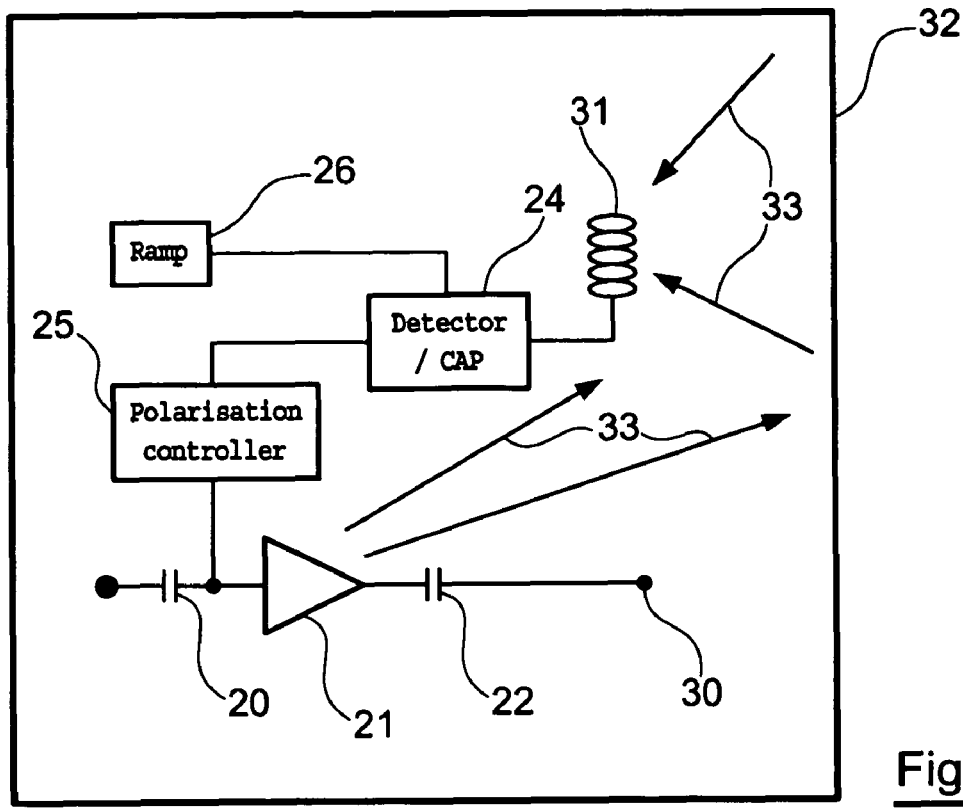
FIG. 3 shows a power amplification device according to an embodiment of the invention, in which the power control supplied at the output includes a closed loop implementing a sensor for detecting the energy radiated in the device.

FIG. 3 shows a synoptic diagram of such a power amplification device according to an embodiment of the invention. As will be noted, in all of the figures of this document, the same elements are designated with the same numeric reference.

In the specific example of FIG. 3, the power amplifier 21 is preceded upstream, and followed downstream, by a coupling capacitor 20, 22. Such coupling capacitors are optional. In the example of FIG. 3, the downstream capacitor 22 separates the output of the power amplifier 21 from the output 30 of the amplification device of FIG. 3. Such an output 30 is, for example, connected to the external antenna of a radiocommunication terminal.

The control of the power supplied to the output 30 of the device, in particular as a function of the temperature, the voltage supplied by the battery of the terminal, the load impedance, is performed by means of a closed control loop including:
  a sensor 31 for detecting the energy radiated in the device, represented by the arrows 33;
  reference means, in the form of a ramp 26, generated by the baseband portion of the radiocommunication terminal, and supplying a reference voltage serving as a set value for the power supplied at the output 30 of the device;
  detection and comparison means 24, also called "detector/comparator" (Detector/CAP), which recover the value of the detected power radiated by the radiating element 31 and compare it to the reference voltage provided by the ramp 26;
  means 25 for controlling the polarisation of the power amplifier 21, enabling, according to the result of the comparison 24, this polarisation to be adjusted, so that the power detected by the detector/comparator 24 and converted into voltage is as close as possible to the reference voltage indicated by the ramp 26.

In other words, at the input of the RF or microwave detector 24, a sensor 31 is placed, which detects the electromagnetic field that radiates in the physical structure of the module of FIG. 3. Therefore, as in the case of couplers (FIG. 2A), an image of the power transmitted to the antenna of the radiotelephone is obtained, thereby making it possible to achieve the control 25 of the polarisation of the power amplifier 21.

The absence of discrete couplers in the power amplification device of FIG. 3 enables its production cost to be significantly reduced.

The device of FIG. 3 also includes a shield 32 that can take the form of a metal dish covering the printed circuit on which the various components are implanted, or a metal gate. More generally, such a shield 32 can take the form of any metallised element and connected to the ground of the circuit, performing a shielding function and covering the printed circuit.

According to the prior art, such a shield 32 was essentially intended to prevent the energy radiated by the power amplification device from leaving the device (in the form of harmonics transported by ambient air), and disturbing the other functional blocks of the radiocommunication terminal, or other neighbouring equipment.

An embodiment of the invention, such a shield 32 also participates in the coupling, by reflecting the radiated energy 33 transported by the ambient environment (the air) toward the sensor 31. the sensor 31 thus recovers the energy reflected by the shield 32, as well as the energy that comes directly from the chip of the power amplifier 21, or leakage by the lines of the printed circuit (PCB, Printed Circuit Board) of the general device.

The proportion of power detected by the sensor 31 that corresponds to the power actually supplied by the amplifier 21 is dependent on the type of sensor, its size and its technical characteristics.

The shield 32 can be considered to account for around half (i.e. 3 dB) of the total power recovered by the sensor 31.

Such a shield 32 must be effective enough to "block" the power radiated by the antenna of the cellular telephone connected to the output 30 of the device, and to prevent this power from being detected by the radiating element 31. Indeed, such an adverse phenomenon would lead to a calibration problem, because the sensor 31 would measure not only the power radiated inside the casing of the device of FIG. 3, but also the power outside this casing, coming from the antenna. The total power detected would then be greater than the power actually radiated in the device, and the polarisation controller 25 would then wrongly reduce the supply voltage of the amplifier 21 so as to reduce the RF or microwave power supplied to the output 30.

To avoid this problem, the inventors of this patent application have estimated that it would be necessary for the shield 32 to cause an attenuation of at least 10 dB, and ideally at least 20 dB, of the external power. In other words, the coupling between the external antenna (connected to the output 30) and the sensor 31 should be around 20 dB less than the coupling between the power amplifier 21 and the sensor 31.

It should be noted that, unlike the conventional solutions of the prior art which attempt to minimise the adverse coupling phenomenon caused by the shield 32, the device of an embodiment of this invention exploits this coupling effect as much as possible, in order to increase the value of the radiated power detected by the sensor 31. To do this, an embodiment of the invention in particular proposes bringing the sensor 31 and the detector 24 of the chip of the power amplifier 21 together as much as possible, whereas until now, in the prior art, these elements have been separated from one another as much as possible.

An embodiment of the invention therefore provides better integrability and allows for reduced bulk by comparison with the conventional devices known until now.

Even if the effect of the shield 32 is very significant in the power amplification device of an embodiment of the invention, it should be noted that the dimensional tolerance (size and thickness) of the shield is very small (typically on the order of 100 μm) faced with the wavelength radiated in the device (for systems of which the operating frequencies are less than 5 GHz), which is not therefore problematic. Reproducibility is ensured for large wavelengths given the physical dimensions of the detector 24 and the sensor 31.

Figure 4A:
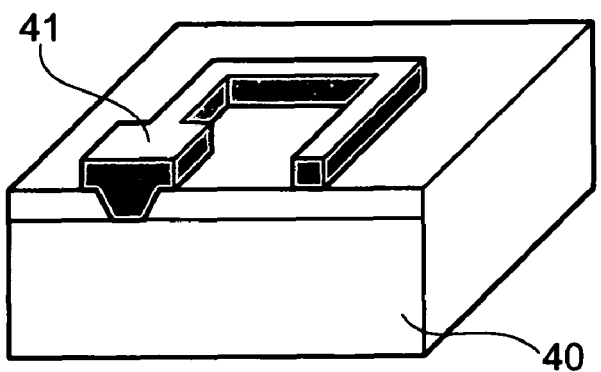
FIGS. 4A and 4B show two embodiments of the sensor of FIG. 3.
Figure 4B:
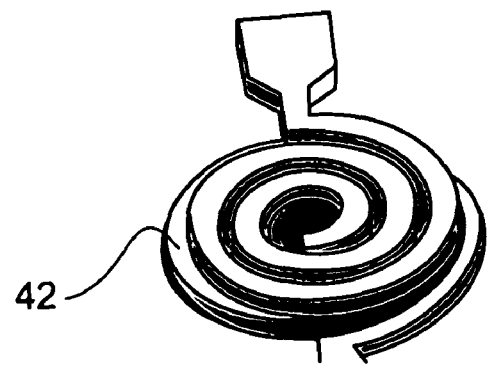

The sensor 31 can take various forms, some of which are shown in FIGS. 4A and 4B.

Thus, in FIG. 4A, the sensor 31 is produced in the form of a MEMS 41 (Micro-Electro-Mechanical System—inductor with high quality factor and high precision) implanted on an integrated circuit 40 produced according to CMOS, BiCMOS or SiGe technology. Such an integrated circuit includes the various elements constituting the power amplification device of an embodiment of the invention (detector, comparator, power amplifier, capacitors, controller, etc.), so that the overall device is very compact.

FIG. 4B shows another embodiment of the sensor 31 in the form of an inductor 42.

More generally, the sensor 31 can be any type of radiating element acting as an antenna and capable of detecting the energy radiated in the power amplification device. In particular, such a sensor 31 can take the form of a line of a PCB routing or a radiating element integrated on the top of a chip, for example the chip of the detector/comparator 24. When the sensor 31 is made in the form of an inductor, it can be, for example, a 12-nH inductor, in a "GSM/DCS dual band" power amplifier.

In an alternative embodiment, the sensor 31 is a tuned LC or RLC circuit, of which the values of the components are selected (according to techniques well known to a person skilled in the art) so as to obtain additional bumps at the operating frequencies of the antenna of the radiocommunication terminal (typically at 900 MHz and 1800 MHz in the case of a GSM cellular telephone).

Regardless of the form chosen for the sensor 31, the power amplification device of an embodiment of the invention is much smaller than the device of the prior art based on couplers (FIG. 2A), which is conventionally produced on a ceramic substrate. In addition, an embodiment of the invention makes it possible to eliminate the resistive attenuator, which is generally located upstream of the coupler according to the prior art.

All of the components of the power amplification device of an embodiment of the invention can be produced according to the same technology, thereby making the integration very easy.

In an alternative embodiment of the invention, the closed control loop of FIG. 3, including in particular the detector/CAP 24 and the controller 25, can be produced in software form. The comparison of powers is then performed in the baseband portion of the radiocommunication terminal.

Figure 5:
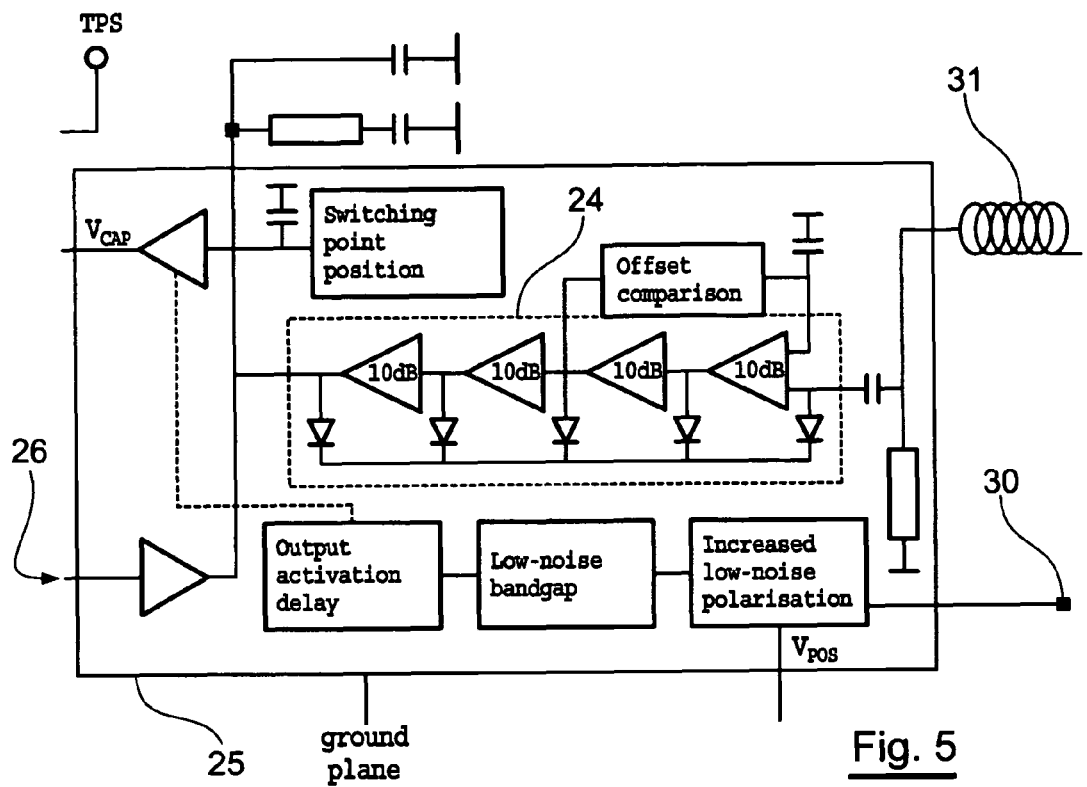
FIG. 5 shows a detailed embodiment of the power amplification device of an embodiment of the invention.

FIG. 5 shows, in greater detail, an example of a practical embodiment of the power amplification device of FIG. 3, more clearly showing the various components of each of the functional blocks 23 to 26. Such an example of an arrangement is provided here by way of illustration, and will not therefore be described here in greater detail.

Figure 6:
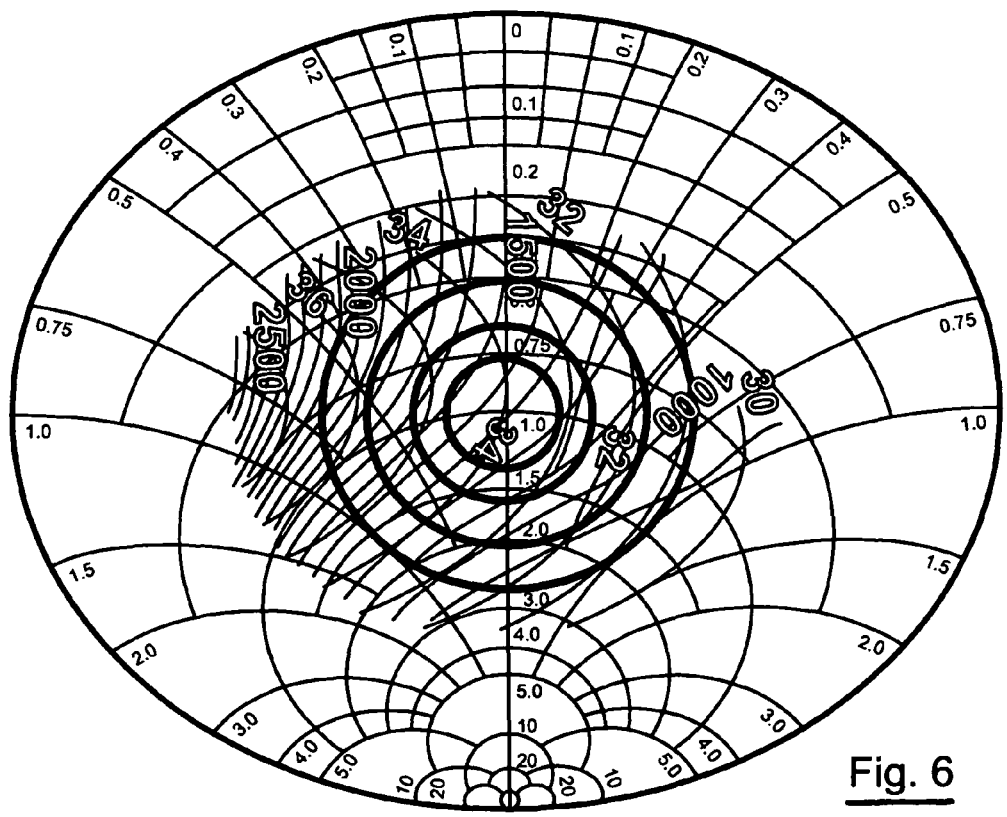
FIG. 6 shows a Smith chart representing the performance, as a function of the load impedance, of the device of an embodiment of the invention.

The Smith chart of FIG. 6 shows the tolerance of the power amplification device of an embodiment of the invention to an antenna of the radiocommunication terminal that is defective, and is not therefore centred on 50Ω. It was established for a power amplifier produced on gallium arsenide (GaAs technology), and shows the variation of the standing-wave ratio or SWR. In the chart of FIG. 6, the farther the load impedance is from the value 50Ω, corresponding to the centre of the chart, the more the SWR increases.

FIGS. 7A to 7D show the comparative performances of the power amplification device of an embodiment of the invention and corresponding devices of the prior art.

Figure 7A:
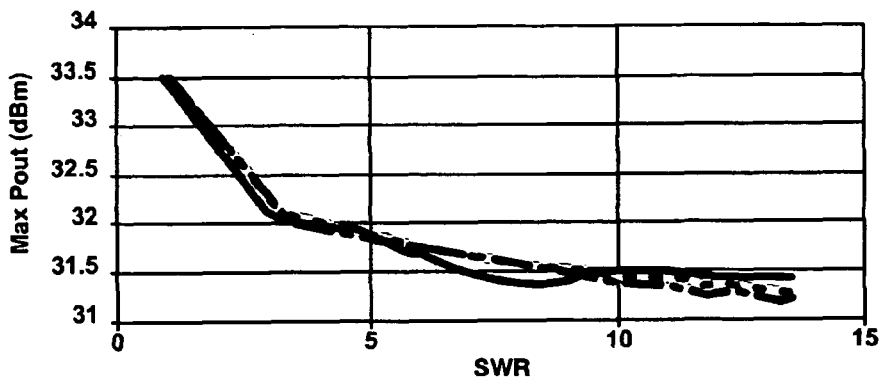
FIGS. 7A to 7D show comparative curves of the influence of load matching on the solution of an embodiment of the invention and the two prior art solutions.
Figure 7B:
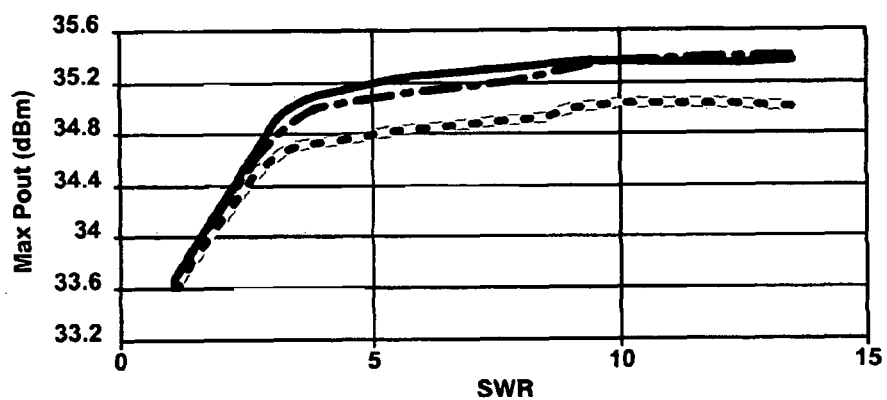
Figure 7C:
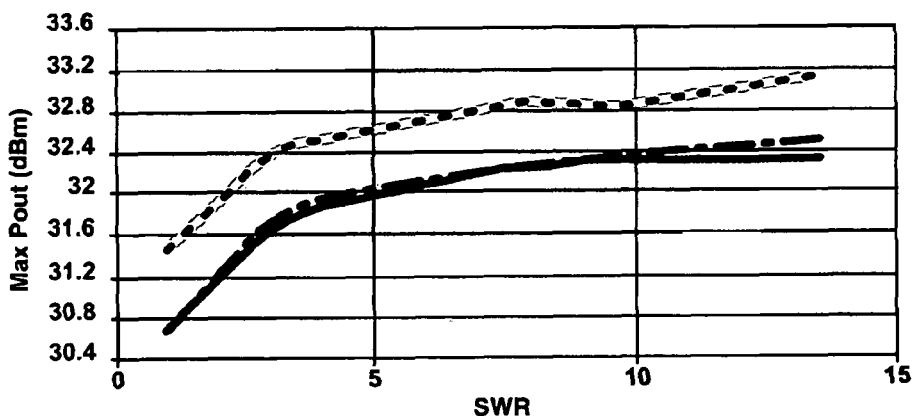
Figure 7D:
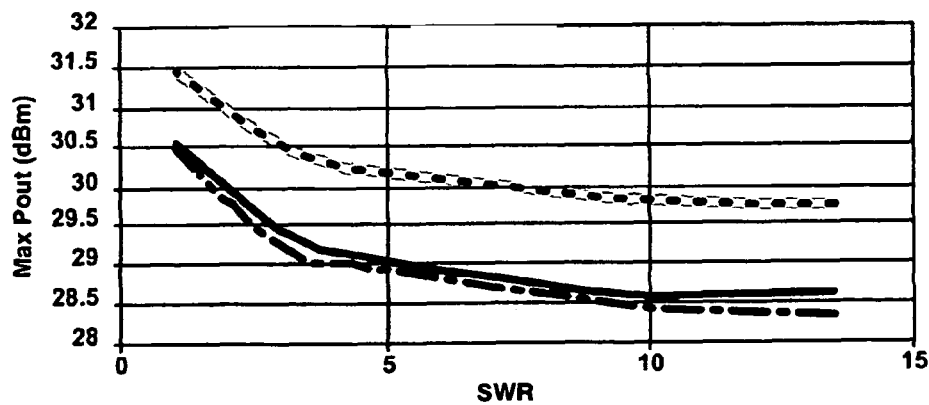

More specifically, FIGS. 7A and 7b correspond to a device for amplifying the power of a radiocommunication terminal according to the GSM standard, while FIGS. 7C and 7D correspond to the same device for a DCS (Digital Cellular System) cellular telephone.

The curves of FIGS. 7A and 7C (respectively, 7B and 7D) show the maximum power supplied at the output of the power amplification device, expressed in dBm, according to the standing-wave ratio, or SWR, and therefore show the maximum (or minimum, respectively) influence of a load mismatch.

Figure 1:
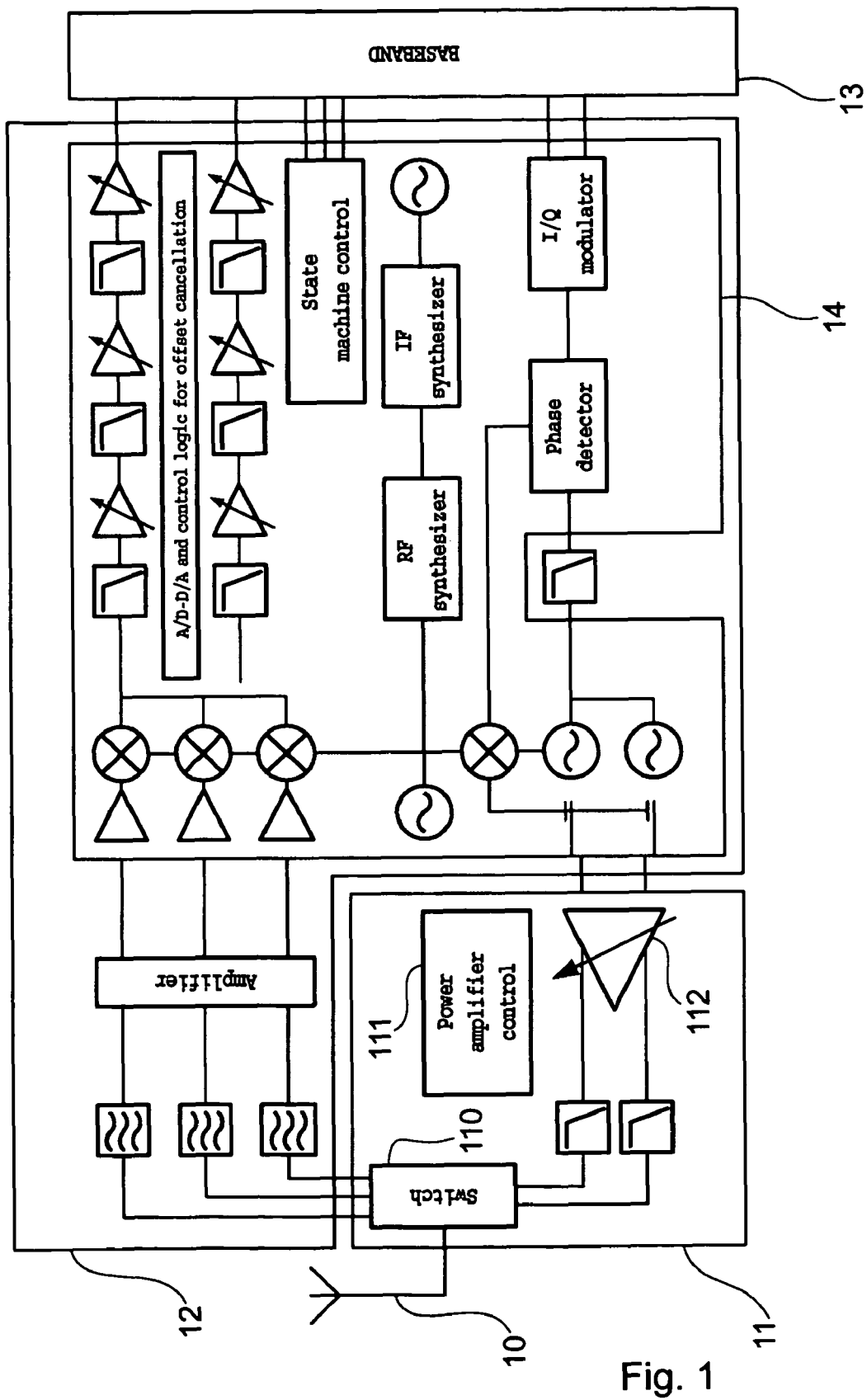
FIG. 1 shows a diagram of the radiofrequency portion of a radiocommunication terminal, including a power amplification device intended to supply the antenna of the terminal.
Figure 2A:
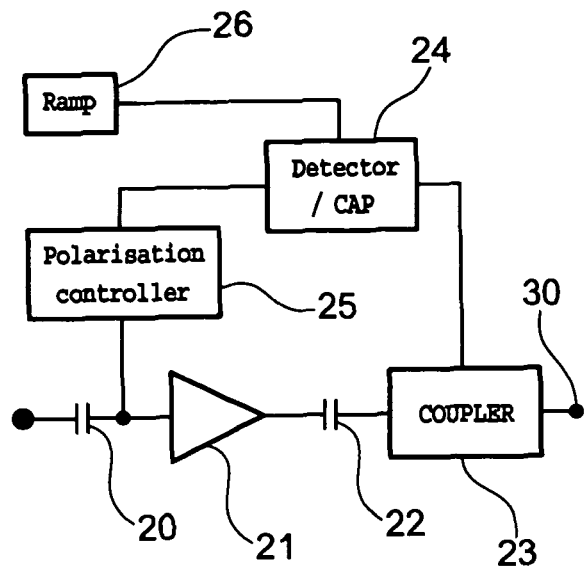
FIGS. 2A to 2C show three prior art techniques for controlling the power supplied at the output of a power amplification device.
Figure 2B:
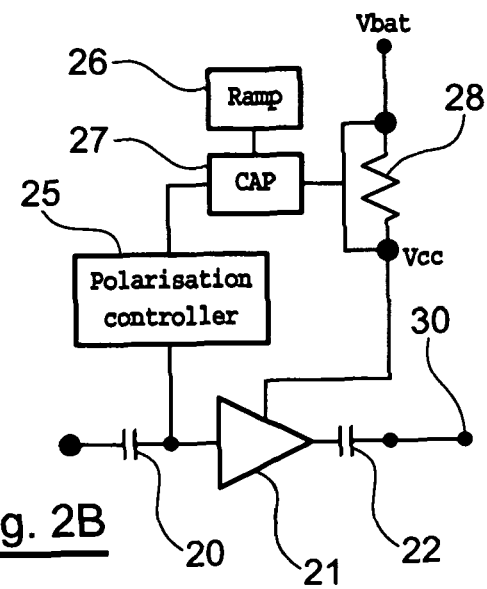
Figure 2C:
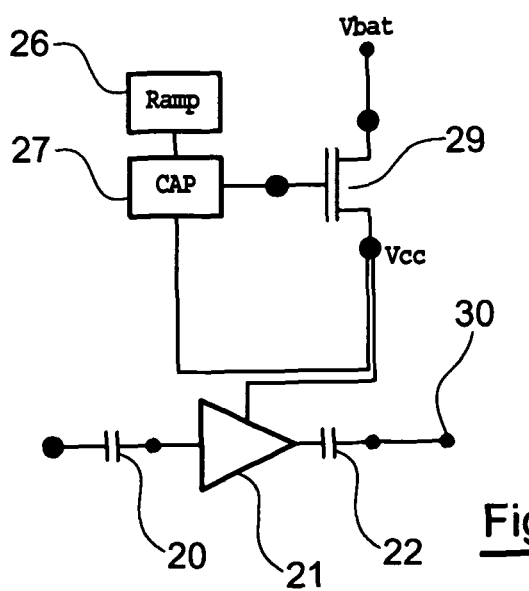

The solid-line curves relate more specifically to a power amplification device with closed loop control of the type shown in FIG. 2A. The mixed-line curves relate to a power amplification device of which the control is achieved in an open loop, and therefore characterise the intrinsic behaviour of the chip of the power amplifier. Finally, the dotted-line curves represent the performance of the device of an embodiment of the invention (FIG. 3).

As can be noted, the performance of the device of an embodiment of the invention, implementing an evaluation of the power radiated in the device, is very similar to that of the closed-loop control device of FIG. 2A, which implements an evaluation, by couplers, of the power conducted in the device.

More generally, the device of an embodiment of the invention performs similarly to that of the prior art based on couplers (FIG. 2A), in terms of both the output power and the behaviour with regard to a load mismatch and performance on the transmission path.

To summarise, the technique for controlling power in the device of an embodiment of the present invention has the following advantages over the prior art techniques:
 lower cost, in particular owing to the elimination of the couplers;
 reduced RF losses on the transmission path;
 performance at least equal to that of the prior art based on couplers, in the case of a load mismatch;
 the possibility of integrating the device in the form of a very small component, owing to the possibility of producing all of the elements of the device with the same technology, and minimising the distance between the detector and the sensor;
 leakages, which were problematic in the prior closed-loop system of FIG. 2A, are no longer problematic.

One or more embodiments of the invention overcome one or more disadvantages of the prior art.

More specifically, an embodiment of the invention provides a technique for controlling the power supplied at the output of a power amplifier, in particular for radiocommunication terminals, of which the performance is at least similar to that of the closed-loop technique of the prior art, in particular in the case of poor load adaptation.

An embodiment of the invention proposes such a technique that is simpler and less expensive to implement than the techniques of the prior art.

An embodiment of the also provides such a technique that allows for easy integration, in particular owing to the compatibility of the design technologies of the various component used.

An embodiment of the invention proposes such a technique that enables the design of a power amplification device that is more compact than that of the prior art.

An embodiment of the invention provides such a technique that has reduced RF losses on the transmission path.

An embodiment of the invention also proposes such a technique that is resistant to any disturbances caused by the antenna to which the generated power is supplied.

An embodiment of the invention provides such a technique that makes it possible to eliminate the need for attenuators in the device for controlling the power supplied at the output.

Although the present invention has been described with reference to preferred embodiments, workers skilled in the art will recognize that changes may be made in form and detail without departing from the spirit and scope of the invention.

The invention claimed is:

1. A radiofrequency (RF) and/or microwave power amplification device, in particular for a radiocommunication terminal, comprising:

means for shielding said device; and means for controlling a power supplied at the output of said device, including a power control loop having reference means, detection means, comparison means and power amplification means, wherein said control means also include at least one sensor positioned within a shielding area defined by the means for shielding for detecting energy radiated in said device.

2. The power amplification device according to claim 1, wherein said shielding means produce a coupling between said power amplification means and said sensor.

3. The power amplification device according to claim 1, wherein sensor belongs to the group including:
   inductors;
   routing lines of a printed circuit of said device;
   MEMS (Micro-Electro-Mechanical Systems);
   radiating elements printed on a printed circuit of said device;
   tuned LC or RLC circuits.

4. The power amplification device according to claim 1, wherein power amplification means and said sensor are placed near one another, so as to optimise a coupling.

5. The power amplification device according to claim 1, wherein shielding means cause an attenuation of at least 10 dB of energy outside said device, detected by said sensor, with respect to said energy radiated in said device, detected by said sensor.

6. The power amplification device according to claim 3, wherein said sensor is a tuned LC or RLC circuit, the values of the components of said tuned circuit are selected so as to maximise said power supplied at the output at at least one predetermined operating frequency of said device.

7. The power amplification device according to claim 1, wherein said control means enable control of said power supplied at the output according to at least one parameter belonging to the group including:
   an operating temperature of said device;
   a supply voltage of said device;
   a load impedance of said device.

8. The power amplification device according to claim 1, wherein said sensor is integrated into said detection means.

9. The power amplification device according to claim 1, wherein said shielding means include a metal shielding cover having a surface substantially parallel to a printed circuit forming the base of said device and four surfaces substantially perpendicular to said surface coming into contact with each of the edges of said printed circuit.

10. A Radiocommunication terminal, wherein it includes a power amplification device according to claim 1.

11. A radiofrequency (RF) and/or microwave power amplification device, in particular for a radiocommunication terminal, comprising:
   a controller, which controls a power supplied at an output of the device and includes a power control loop having a power amplifier, which radiates energy in the device and is coupled to the output, a sensor, which senses the energy radiated in the device, a detector coupled to the sensor, and a comparator coupled to the detector, which compares an output from the detector to a reference; and
   a shield, which reflects the energy radiated in the device toward the sensor, wherein the sensor is positioned within a shielding area defined by the shield.

* * * * *